(12) United States Patent
Kim et al.

(10) Patent No.: US 7,852,449 B2
(45) Date of Patent: Dec. 14, 2010

(54) LIQUID CRYSTAL DISPLAY DEVICE AND METHOD OF FABRICATING THE SAME

(75) Inventors: Jeom Jae Kim, Seoul (KR); Hong Man Moon, Kyongsangbuk-do (KR); Sung Hak Jo, Seoul (KR); Sang Don Yang, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 12/457,380

(22) Filed: Jun. 9, 2009

(65) Prior Publication Data

US 2009/0262293 A1 Oct. 22, 2009

Related U.S. Application Data

(62) Division of application No. 10/861,525, filed on Jun. 7, 2004, now Pat. No. 7,576,826.

(30) Foreign Application Priority Data

Feb. 25, 2004 (KR) ...................... 10-2004-0012828

(51) Int. Cl.
*G02F 1/1339* (2006.01)

(52) U.S. Cl. .................................................. 349/155

(58) Field of Classification Search ........................ None
See application file for complete search history.

(56) References Cited

U.S. PATENT DOCUMENTS

| | | | |
|---|---|---|---|
| 5,459,598 A | 10/1995 | Carrington | |
| 5,499,128 A | 3/1996 | Hasegawa et al. | |
| 5,969,784 A | 10/1999 | Miyazaki et al. | |
| 6,067,144 A | 5/2000 | Murouchi | |
| 6,287,733 B1 | 9/2001 | Miyazaki et al. | |
| 6,339,462 B1 | 1/2002 | Kishimoto et al. | |
| 6,583,846 B1 | 6/2003 | Yanagawa et al. | |
| 6,850,309 B2 | 2/2005 | Inoue et al. | |
| 2001/0052959 A1 | 12/2001 | Tamatami et al. | |
| 2002/0005929 A1 | 1/2002 | Imabayashi et al. | |
| 2002/0054267 A1 | 5/2002 | Matsumoto et al. | |
| 2002/0171800 A1 | 11/2002 | Miyazaki et al. | |
| 2003/0025868 A1 | 2/2003 | Hiroshima et al. | |
| 2003/0048403 A1 | 3/2003 | Satoh | |
| 2004/0201815 A1 | 10/2004 | Yamamoto | |

FOREIGN PATENT DOCUMENTS

| | | |
|---|---|---|
| JP | 09-73099 | 3/1997 |
| JP | 10-048640 | 2/1998 |
| JP | 10-104591 | 4/1998 |

(Continued)

*Primary Examiner*—Timothy Rude
(74) *Attorney, Agent, or Firm*—Morgan, Lewis & Bockius LLP

(57) ABSTRACT

A liquid crystal display (LCD) device includes first and second substrates facing each other, a plurality of column spacers on at least one of the first and second substrates, each column spacer including first pattern second patterns, the first and second patterns being connected to each other, the second pattern having a contact surface less than the first pattern, and a liquid crystal layer between the first and second substrates.

2 Claims, 18 Drawing Sheets

FOREIGN PATENT DOCUMENTS

| | | |
|---|---|---|
| JP | 10-123534 | 5/1998 |
| JP | 11-295742 | 10/1999 |
| JP | 2005-208583 | 10/1999 |
| JP | 2003-84289 | 3/2003 |
| JP | 2003-121857 | 4/2003 |
| JP | 2003-131239 | 5/2003 |
| JP | 2005-122150 | 5/2005 |
| KR | 1998-033358 | 7/1998 |
| KR | 10-0211806 | 5/1999 |
| KR | 10-0227692 | 5/1999 | generation of shift on upper substrate by touch

LIQUID CRYSTAL DISPLAY DEVICE AND METHOD OF FABRICATING THE SAME

This application is a Divisional of U.S. patent application Ser. No. 10/861,525, filed Jun. 7, 2004 now U.S. Pat. No. 7,576,826 and claims the benefit of the Korean Application No. P 2004-12828, filed on Feb. 25, 2004, both of which are hereby incorporated by reference in their entirety.

BACKGROUND OF THE INVENTION

1. Field of the Invention

The present invention relates to a liquid crystal display (LCD) device, and more particularly, to an LCD device having a column spacer capable of preventing generation of spots on a screen when an LCD panel is touched, and a method of fabricating the same.

2. Discussion of the Related Art

Demands for various display devices have increased with development of the information technology society. Accordingly, many efforts have been made to research and develop various flat display devices such as LCD, plasma display panel (PDP), electroluminescent display (ELD), and vacuum fluorescent display (VFD). Some species of flat display devices have already been applied to displays for various equipments. Among the various flat display devices, LCD devices have been most widely utilized because of their advantageous characteristics of thin profile, lightness in weight, and low power consumption, and become substitutes for cathode ray tube (CRT) devices. In addition to mobile type LCD devices such as notebook computers, LCD devices have been utilized for computer monitors and televisions receiving and displaying broadcasting signals. While various technical developments in the LCD technology have been applied to different fields, research in enhancing the picture quality of the LCD devices has not reached as far as that in other features and advantages of the LCD device. In order to use LCD devices in various fields as a general display, it is important to develop an LCD device capable of showing a high quality picture with high resolution and high luminance on a large-sized screen, while still maintaining lightness in weight, thin profile, and low power consumption.

Next, a related art LCD device having spacers for maintaining a cell gap between substrates will be described with reference to the accompanying drawings. FIG. 1 is an expanded perspective view illustrating the related art LCD device. As shown in FIG. 1, the LCD device includes first and second substrates 1, 2, and a liquid crystal layer 3 formed between the first and second substrates 1, 2 by injection. Specifically, the first substrate 1 includes a plurality of gate lines 4 arranged along a first direction at fixed intervals, a plurality of data lines 5 arranged along a second direction perpendicular to the first direction at fixed intervals, a plurality of pixel electrodes 6 arranged in a matrix-type configuration within pixel regions P defined by crossing of the gate and data lines 4, 5, and a plurality of thin film transistors T enabled according to signals supplied to the gate lines 4 for transmitting signals from the data lines 5 to the pixel electrodes 6. Also, the second substrate 2 includes a black matrix layer 7 that prevents light from portions of the first substrate 1 except the pixel regions P, an R/G/B color filter layer 8 for displaying various colors, and a common electrode 9 for producing the image on the color filter layer 8. In this related art LCD device, the liquid crystal layer 3 has a plurality of liquid crystal molecules that are driven by an electric field generated between the pixel electrode 6 and the common electrode 9. That is, an alignment direction of the liquid crystal molecules of the liquid crystal layer 3 is controlled by the induced electric field thereto. Accordingly, light irradiated through the liquid crystal layer 3 may be controlled by the alignment direction of the liquid crystal molecules, thereby displaying an image. This kind of LCD device may be referred to as a TN mode LCD device, which has disadvantageous characteristics such as a narrow viewing angle. In order to overcome this problem, an in-plane switching (IPS) mode LCD device has been actively developed, wherein a pixel electrode and a common electrode are formed in a pixel region in parallel to each other at a fixed interval, thereby generating an electric field parallel to substrates between the pixel electrode and the common electrode and aligning liquid crystal molecules of a liquid crystal layer.

Next, a method of fabricating the related art IPS mode LCD device will be described with reference to the accompanying drawings. In general, there are two methods for fabricating an LCD device: a liquid crystal injection method and a liquid crystal dispersion method.

First, the liquid crystal injection method will be described as follows. FIG. 2 is a flow chart illustrating the liquid crystal injection method, which may be divided into three processes: an array process, a cell process, and a module process. The array process mainly includes two steps: forming a TFT array having gate and data lines, a pixel electrode and a thin film transistor on a first substrate, and forming a color filter array having a black matrix layer, a color filter layer and a common electrode on a second substrate. During the array process, a plurality of LCD panel regions are formed on one large glass substrate, and the TFT array and the color filter array are formed in each LCD panel region. After that, the TFT substrate and the color filter substrate are moved to a cell process line. Subsequently, an alignment material is coated on the TFT substrate and the color filter substrate, and an alignment process (rubbing process) S10 is performed to the substrates to obtain a uniform alignment direction in the liquid crystal molecules. At this time, the alignment process S10 is carried out in order of processes for cleaning before deposition of an alignment layer, printing the alignment layer, baking the alignment layer, inspecting the alignment layer and rubbing the alignment layer. Then, at a cleaning process S20, the TFT substrate and the color filter substrate are respectively cleaned. After that, at a spacer scattering process S30, ball spacers for maintaining a cell gap between the two substrates are scattered on one of the two substrates, and then at a sealant coating process S40, a seal pattern is formed corresponding to the circumference of respective LCD panel regions to bond the two substrates to each other. At this time, the seal pattern has a liquid crystal injection inlet through which liquid crystal is injected. The ball spacers are formed of plastic balls or elastic plastic minute particles.

Then, at a bonding/hardening process S50, the TFT substrate and the color filter substrate having the seal pattern therebetween are opposite to each other, and bonded to each other, and then the seal pattern is hardened. After that, at a cutting/processing process S60, the TFT substrate and the color filter substrate bonded to each other are cut into the respective LCD panel regions, thereby fabricating the unit LCD panels each having a fixed size. Subsequently, at an injection/seal process S70, the liquid crystal is injected to the LCD panel through the liquid crystal injection inlet, and then the liquid crystal injection inlet is sealed, thereby forming a liquid crystal layer. Finally, an inspection process S80 is conducted for an external appearance and an electric failure in the LCD panel. Thus, the process of fabricating the LCD device is completed.

Herein, the process for injecting the liquid crystal will be described in brief. First, the LCD panel and a container having liquid crystal material are provided in a chamber which is maintained in a vacuum state. That is, moisture and air bubble are removed simultaneously from the liquid crystal material and the container, and an inside space of the LCD panel is maintained in a vacuum state. Then, a liquid crystal injection inlet of the LCD panel is dipped into the container to change the vacuum state inside the chamber to an atmospheric pressure. Thus, the liquid crystal material is injected to the inside of the LCD panel through the liquid crystal injection inlet according to a pressure difference between the inside the LCD panel and the chamber.

However, the liquid crystal injection method has the following disadvantages. First, after the large glass substrate is cut into the respective LCD panel regions, the liquid crystal injection inlet is dipped into the container having the liquid crystal material while maintaining the vacuum state between the two substrates. Thus, it takes great time in injecting the liquid crystal material between the two substrates, thereby lowering yield. In case of forming a large sized LCD device, it is difficult to completely inject the liquid crystal material into the inside of the LCD panel, thereby causing the failure due to incomplete injection of the liquid crystal material. Furthermore, it takes great time in injecting the liquid crystal material, and it also requires a large space for liquid crystal injection devices.

In order to overcome these problems caused by the liquid crystal injection method, the liquid crystal dispersion method has been proposed, in which two substrates are bonded to each other after dispersing liquid crystal material on any one of the two substrates. FIG. 3 is a flow chart illustrating the liquid crystal dispersion method. In this method, before the two substrates are bonded, the liquid crystal is dispersed on any one of the two substrates. It is impossible to use ball spacers for maintaining a cell gap between the two substrates since the ball spacers move to a dispersion direction of the liquid crystal material. Thus, instead of the ball spacers, patterned spacers or column spacers are fixed to the substrate to maintain the cell gap between the two substrates. That is, as shown in FIG. 3, during an array process, a black matrix layer, a color filter layer and an overcoat layer are formed on the color filter substrate. Then, a photosensitive resin is formed on the overcoat layer, and selectively removed to form the column spacer on the overcoat layer above the black matrix layer. The column spacers may be formed in a photo process or an ink-jet process. After that, alignment layers are respectively coated on entire surfaces of the TFT substrate and the color filter substrate including the column spacers, and a rubbing process is performed thereto.

Then, at a cleaning process S101, the TFT substrate and the color filter substrate are cleaned. At a liquid crystal dispersion process S102, the liquid crystal material is dispersed on one of the two substrates. At a seal pattern dispensing process S103, a seal pattern is formed in the circumference of an LCD panel region on the other of the two substrates by a dispensing device. At this time, it is possible to perform dispersion of the liquid crystal and formation of the seal pattern on any one of the two substrates. At an inversion process S104, the other substrate having no dispersion of the liquid crystal material is inversed.

After that, at a bonding/hardening process S105, the TFT substrate and the color filter substrate are bonded to each other by pressure, and the seal patterned is hardened. Subsequently, at a cutting/processing process S106, the bonded substrates are cut into the respective LCD panels. Finally, an inspection process S107 is conducted for an external appearance and an electric failure in the LCD panel. The process of fabricating the LCD device is thus completed.

FIG. 4 is a cross-sectional view schematically illustrating the related art LCD device on which the column spacers are formed. In FIG. 4, the LCD device includes the color filter substrate 2 on which a plurality of column spacers 20 are formed, and the TFT substrate 1 on which the liquid crystal 3 is dispersed. As mentioned above, the column spacers 20 are fixed to the color filter substrate 2, and the color filter substrate 2 is in contact with the TFT substrate 1. The column spacers 20 each have a flat surface being in contact with the TFT substrate 1. Accordingly, the LCD device fabricated by the liquid crystal injection method includes the spherical ball spacers, and the spherical ball spacers are not fixed to the substrate, whereby it obtains a great restoring force of the liquid crystal even in case of external impacts (pressing, rubbing, or the like). That is, even though the external force is applied for the LCD panel, it does not generate spots on the screen.

However, the related art LCD device using the column spacers has the following disadvantages. First, the column spacers are fixed to one substrate, and the column spacers have the flat surface being in contact with the TFT substrate, thereby causing a great frictional force due to the increase in the contact surface to the substrate. Accordingly, in a case where the screen of the LCD device having the column spacers is rubbed, spots may be generated on the screen for a long time. FIG. 5A and FIG. 5B are a plane view and a cross-sectional view illustrating the spots generated on the screen by touching the LCD panel. If the LCD panel 10 is continuously touched with a finger along a predetermined direction as shown in FIG. 5A, the upper substrate of the LCD panel 10 is shifted at a predetermined interval along the touch direction as shown in FIG. 5B. At this time, in a case where the cylindrical column spacers are in contact with the lower and upper substrates, it causes the great frictional force between the column spacers and the two opposing substrates 1, 2. Thus, the liquid crystal molecules between the column spacers are not restored to the original state, thereby generating the spots on the screen. Also, when the LCD panel is touched with the finger along the predetermined direction as shown in FIG. 5B, the liquid crystal molecules gather to the region around the touch portion, thereby causing the region around the touch portion to protrude. In this case, a cell gap h1 corresponding to a protruding portion is higher than a cell gap h2 of the remaining portions, thereby generating a light leakage. Accordingly, it is impossible to obtain the uniform luminance.

If the amount of liquid crystal material dispersed on the substrate is increased to overcome the problem of the spots on the screen by touch, it may cause another problem due to gravity force. That is, since the LCD device is usually utilized as a display of a monitor, a notebook computer, or a television, the LCD device is usually installed in vertical. Thus, the liquid crystal molecules of the LCD panel may move to the direction of gravity. In particular, when the LCD panel is at a high temperature, the movement of liquid crystal molecules becomes serious because the liquid crystal has great thermal expansion.

The ball spacers are formed in a large amount. However, the column spacers are selectively formed on the portions except for the pixel regions. Accordingly, when the LCD panel is pressed at a predetermined portion having no column spacers, the substrates are bent, and maintained in a hollow state due to low restoring speed, thereby generating spots on the screen.

SUMMARY OF THE INVENTION

Accordingly, the present invention is directed to a spacer of an LCD device and a method of fabricating the same that substantially obviates one or more problems due to limitations and disadvantages of the related art.

An object of the present invention is to provide a spacer of an LCD device and a method of fabricating the same, to prevent spots from generating on a screen when an LCD panel is touched.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, an LCD device includes first and second substrates facing each other, a plurality of column spacers on at least one of the first and second substrates, each column spacer including first and second patterns, the first and second patterns being connected to each other, the second pattern having a contact surface less than the first pattern; and a liquid crystal layer between the first and second substrates.

In another aspect, an LCD device includes a first substrate having a TFT array, a second substrate having a color filter array opposing to the first substrate, a first column spacer in contact with the first and second substrates, a second column spacer on the second substrate and separate from the first substrate, and a liquid crystal layer between the first and second substrates.

In another aspect, an LCD device includes a first substrate having a TFT array, a second substrate having a color filter array opposing to the first substrate, a first column spacer on the second substrate, the first column spacer including a first pattern having a first cross-section and a first height and a second pattern having a second cross-section and a second height smaller than those of the first pattern, the first and second patterns being connected to each other, a second column spacer on the second substrate to have a height corresponding to the first height of the first pattern of the first column spacer, and a liquid crystal layer between the first and second substrates.

In another aspect, a method of fabricating an LCD device includes forming a TFT array on a first substrate, forming a color filter array on a second substrate, forming a plurality of column spacers on the second substrate, each column spacer including a first pattern and a second pattern, the first and second patterns being connected to each other, the second pattern having a contact surface less than the first pattern, dispersing a liquid crystal material on the first substrate, and bonding the first and second substrates to each other.

In another aspect, a method of fabricating an LCD device includes forming a TFT array on a first substrate, forming a color filter array on a second substrate, forming first and second column spacers having the different heights on the second substrate, dispersing a liquid crystal material on the first substrate, and bonding the first and second substrates to each other.

In another aspect, a method of fabricating an LCD device includes forming a TFT array on a first substrate, forming a color filter array on a second substrate, forming a first column spacer on the second substrate, the first column spacer including a first pattern having a first cross-section and a first height and a second pattern having a second cross-section and a second height smaller than those of the first pattern, the first and second patterns being connected to each other, forming a second column spacer on the second substrate to have a height corresponding to the first height of the first pattern of the first column spacer, dispersing a liquid crystal material on the first substrate, and bonding the first and second substrates to each other.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Figure 1:
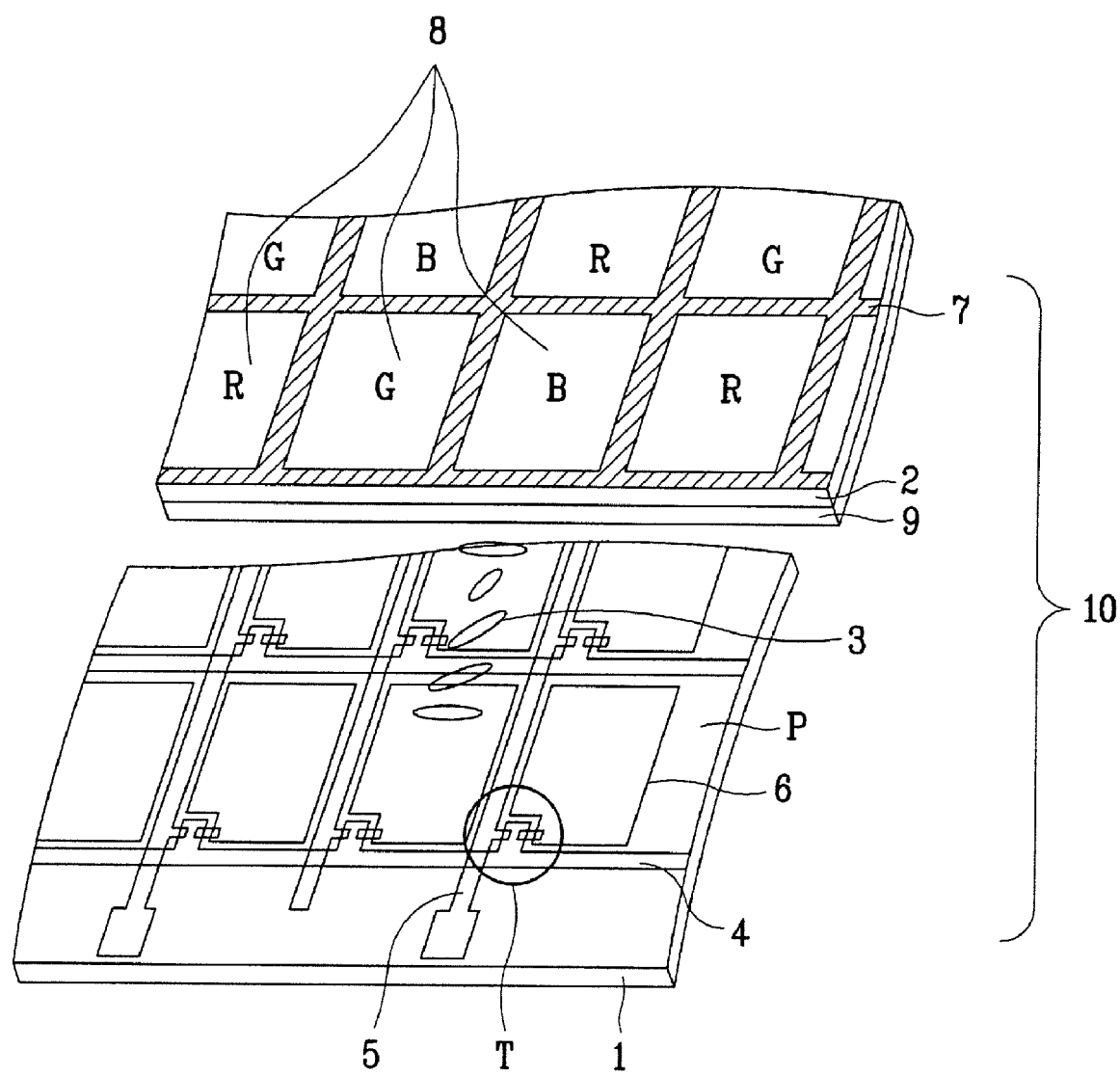
FIG. 1 is an expanded perspective view illustrating a related art LCD device.
Figure 2:
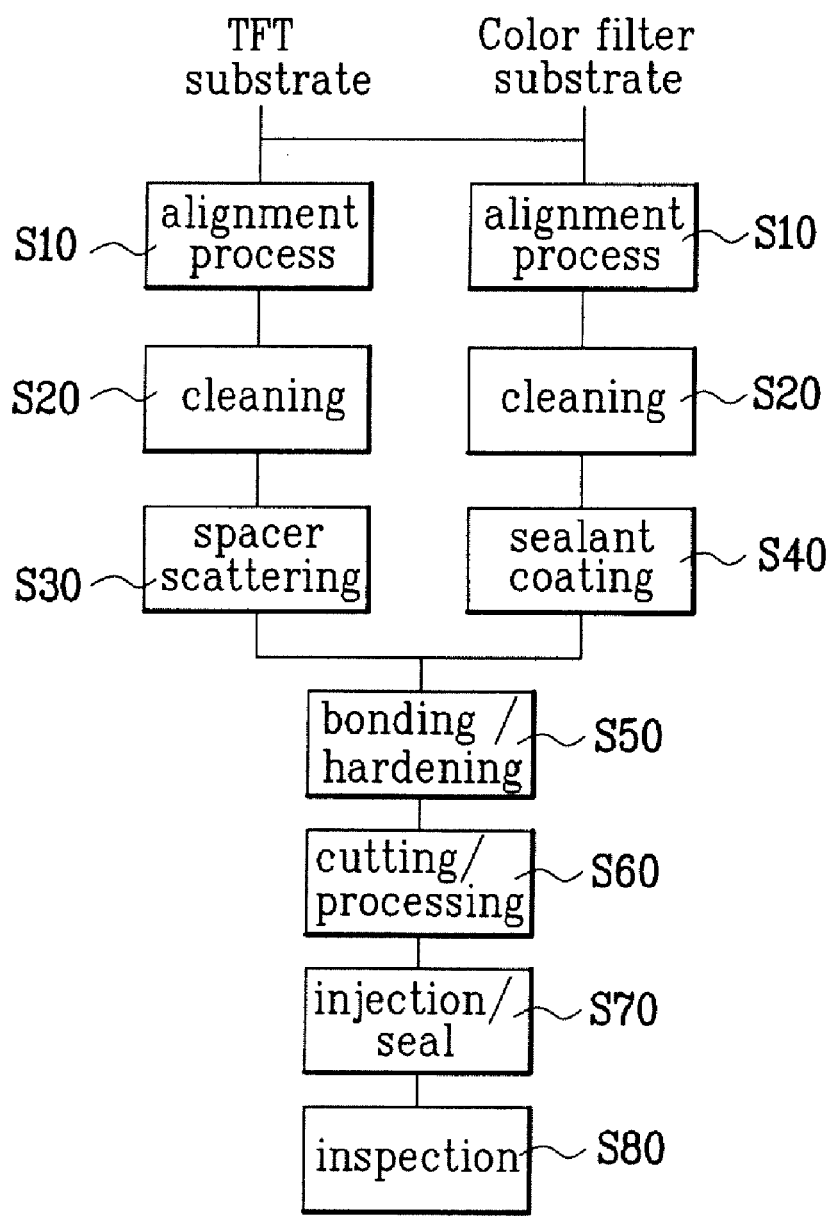
FIG. 2 is a flow chart illustrating a method of fabricating the related art LCD device according to a liquid crystal injection method.
Figure 3:
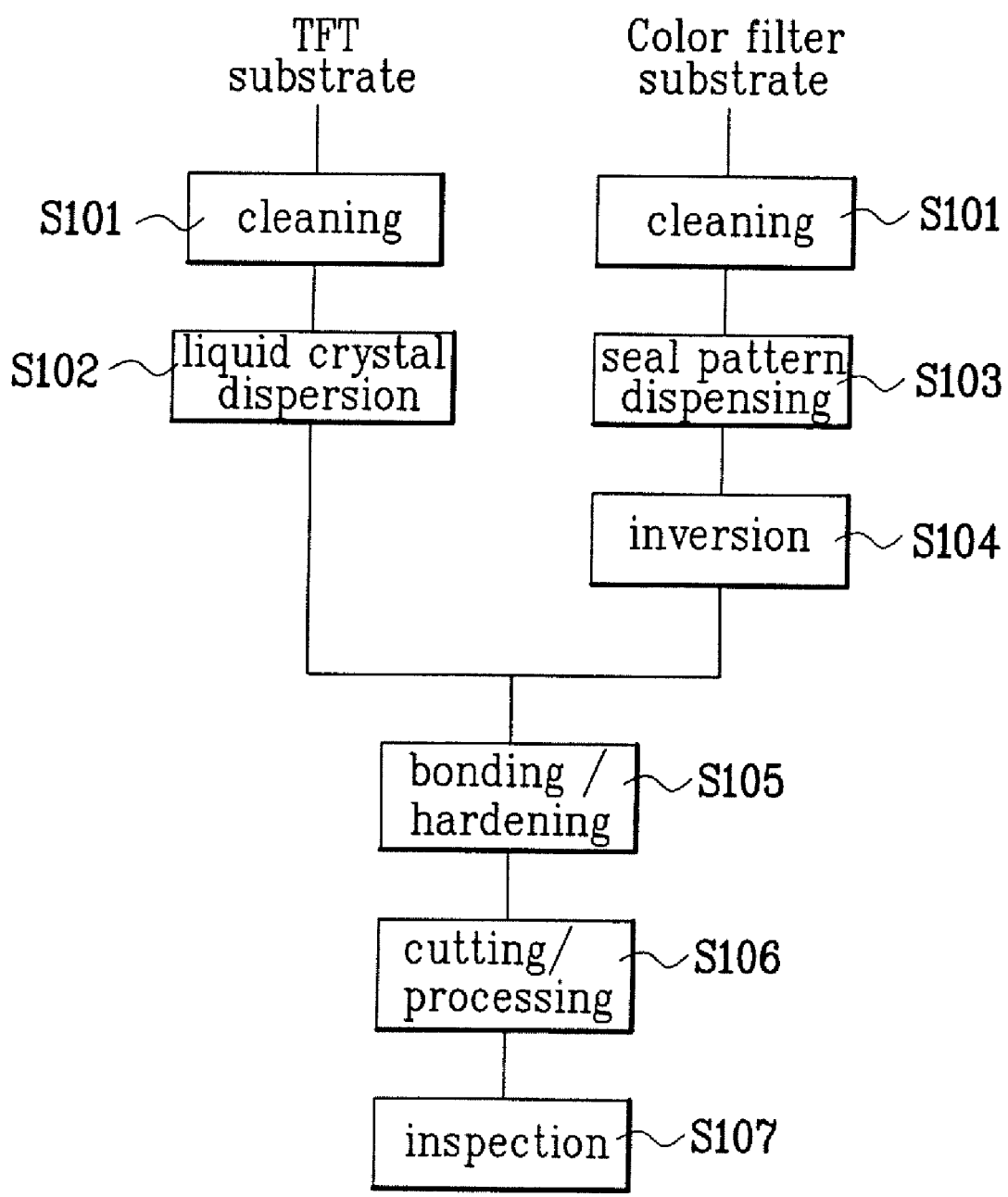
FIG. 3 is a flow chart illustrating a method of fabricating the related art LCD device according to a liquid crystal dispersion method.
Figure 4:
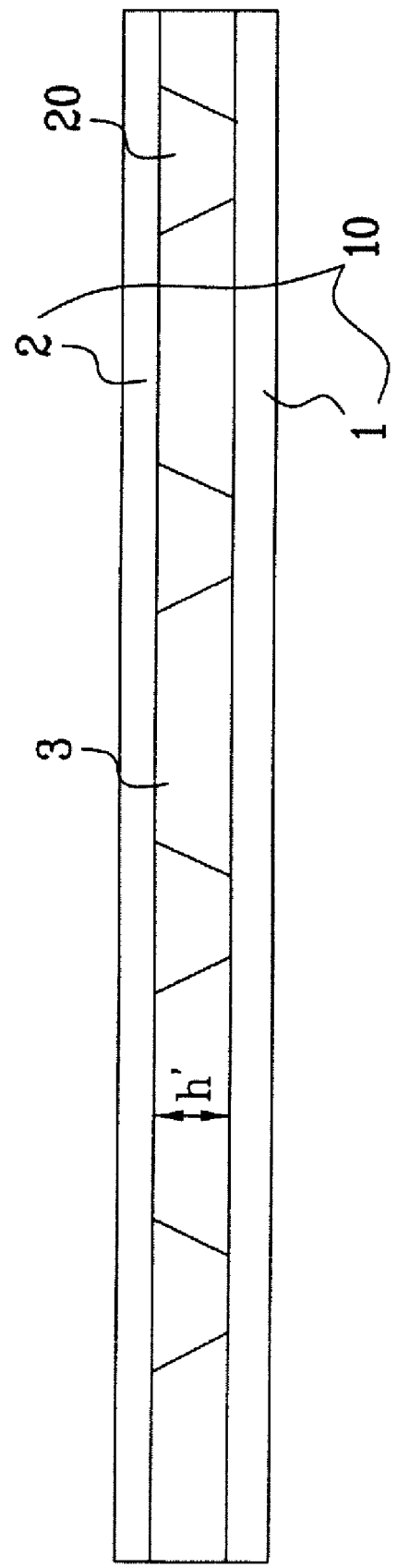
FIG. 4 is a cross-sectional view schematically illustrating the related art LCD device having column spacers.
Figure 5A:
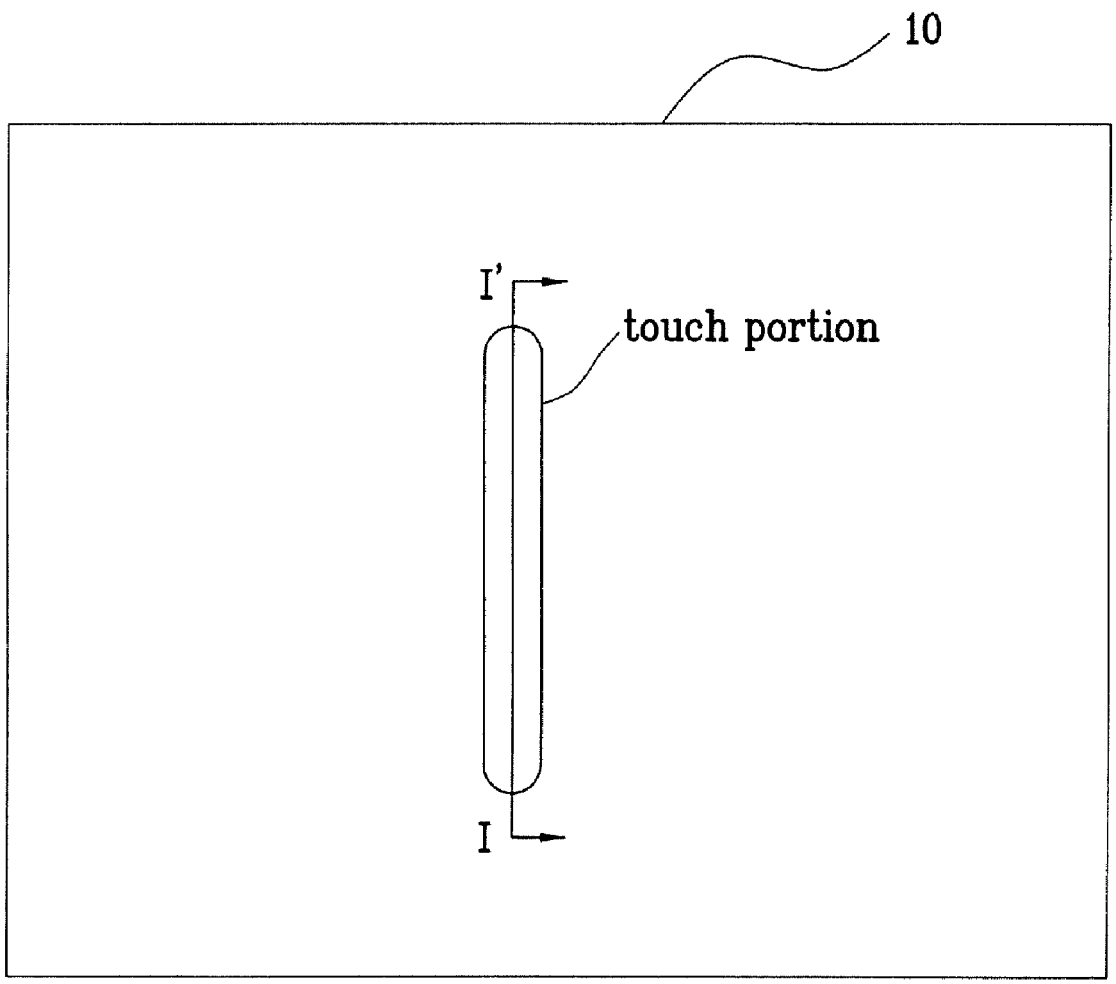
FIG. 5A and FIG. 5B are a plane view and a cross-sectional view illustrating how spots are generated in the related art LCD device.
Figure 5B:
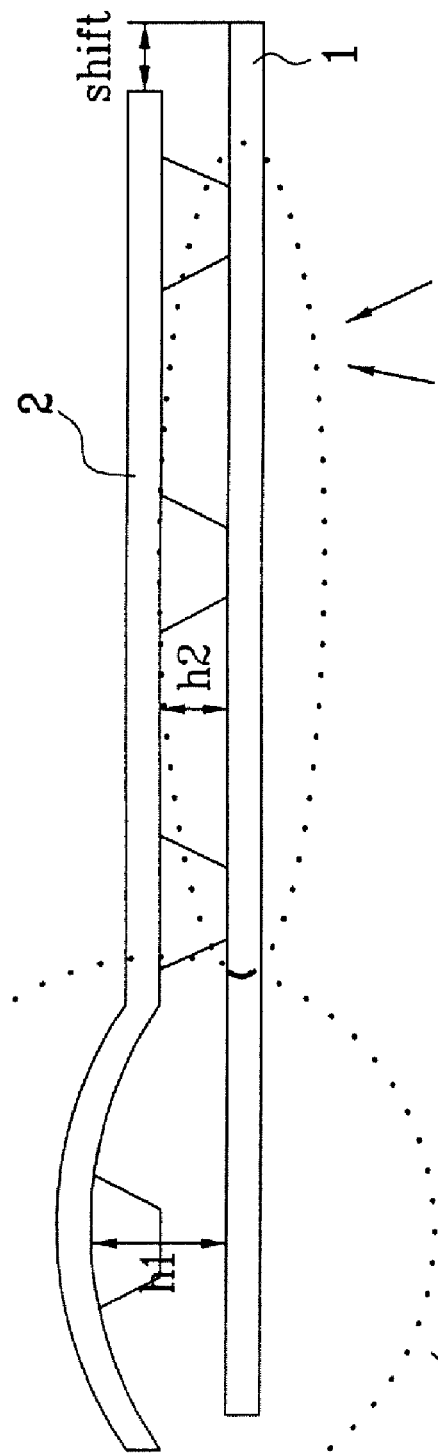

Reference will now be made in detail to the preferred embodiments of the invention, examples of which are illustrated in the accompanying drawings. Wherever possible, the same reference numerals will be used throughout the drawings to refer to the same or like parts.

Next, an LCD device according to the preferred embodiments of the invention and a method of fabricating the same will be described with reference to the accompanying drawings.

Figure 6:
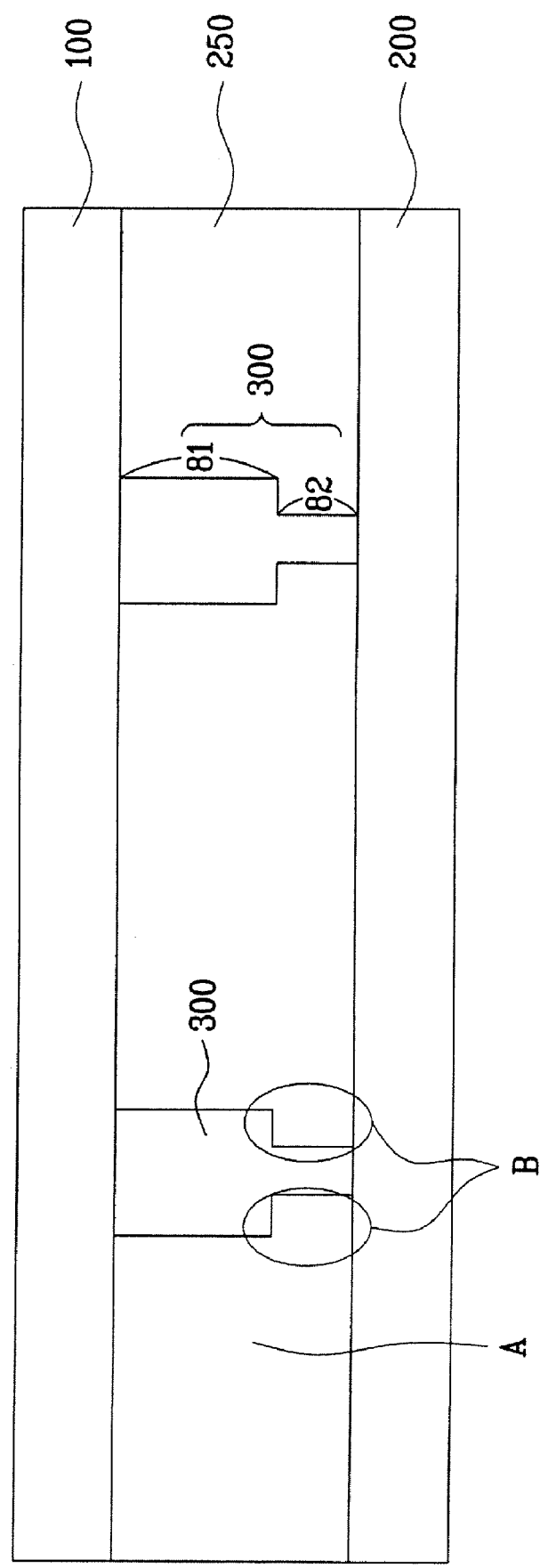
FIG. 6 is a cross-sectional view illustrating an LCD device according to a first embodiment of the present invention.

FIG. 6 is a cross-sectional view schematically illustrating an LCD device according to a first embodiment. As shown in FIG. 6, the LCD device includes a color filter substrate 100 having a color filter array thereon, a TFT substrate 200 having a TFT array opposite to the color filter array, and a liquid crystal layer 250 between the color filter substrate 100 and the TFT substrate 200. The color filter substrate 100 includes a plurality of column spacers 300, each of which further includes a first pattern 81 having a first cross-section and a first height, and a second pattern 82 having a second cross-section and a second height. As shown in FIG. 6, the second pattern 82 is connected to the first pattern 81. Also, the first cross-section and the first height of the first pattern 81 are larger in size than the second cross-section and the second height of the second pattern 82.

Figure 7A:
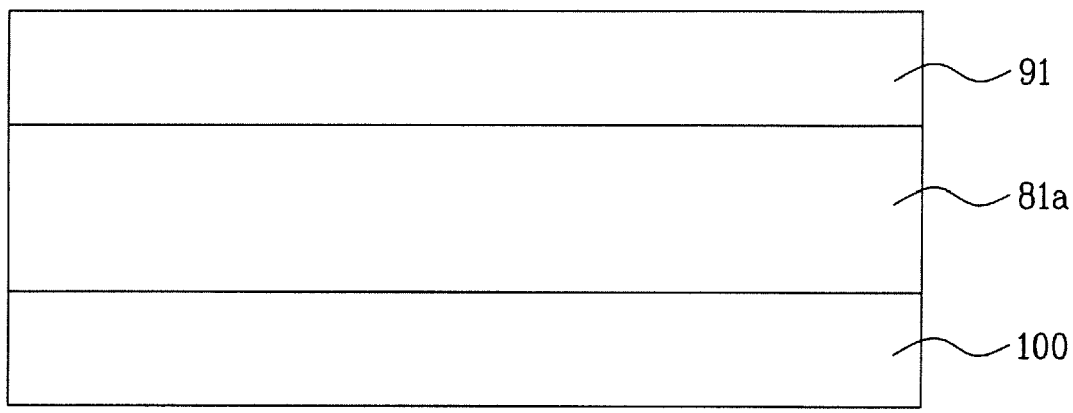
FIG. 7A to FIG. 7E are cross-sectional views illustrating a method of forming a column spacer according to an embodiment of the invention.
Figure 7B:
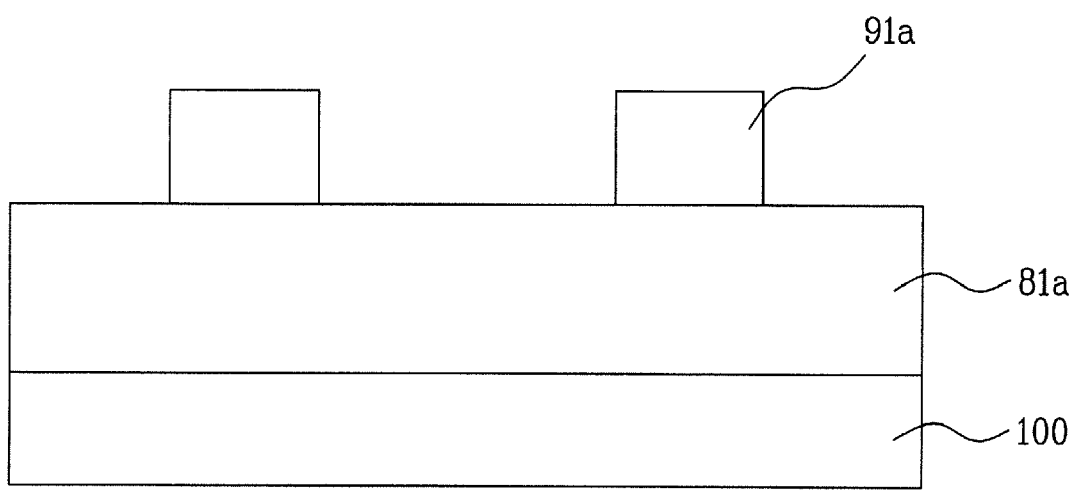
Figure 7C:
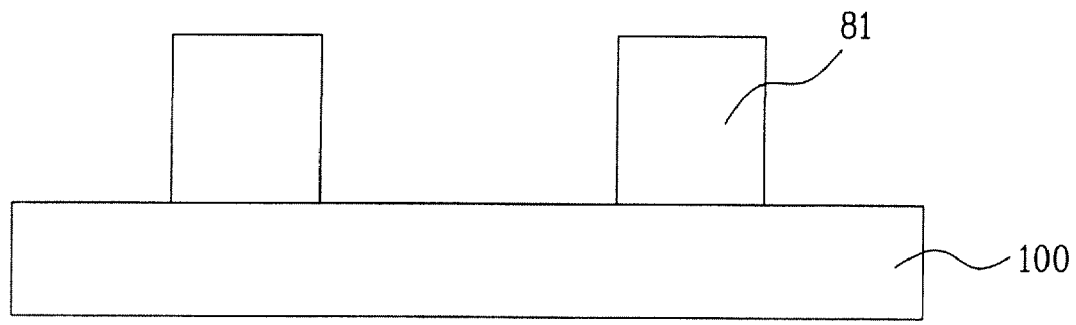
Figure 7D:
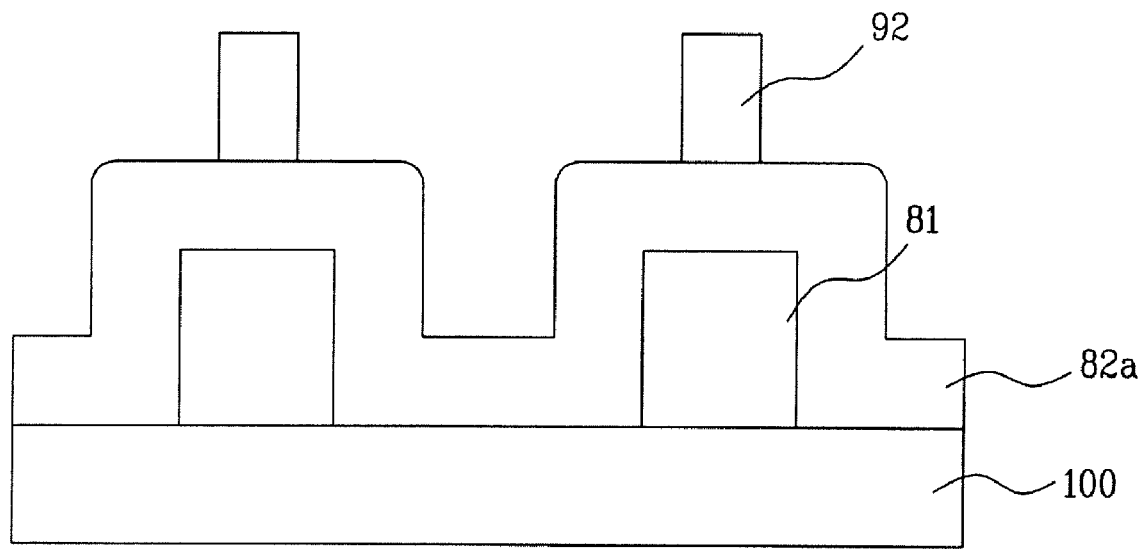
Figure 7E:
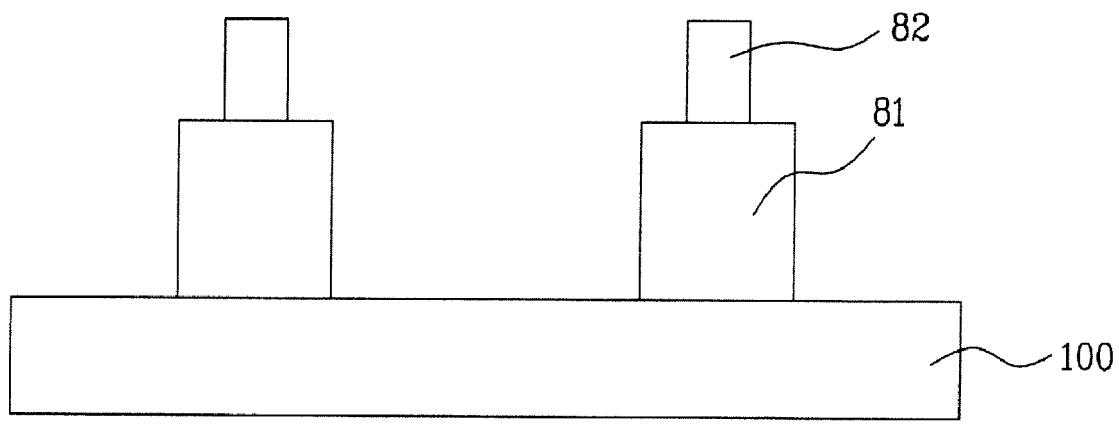

FIG. 7A to FIG. 7E are cross-sectional views illustrating a method of forming the column spacer 300. In FIG. 7A, a first organic insulating layer 81a and a photoresist layer 91 are sequentially formed on the color filter substrate 100. In FIG. 7B, a first photoresist pattern 91a is formed by performing an exposure and developing process to the photoresist layer 91. In FIG. 7C, the first organic insulating layer 81a is selectively removed by using the first photoresist pattern 91a as a mask, thereby forming the first pattern 81. Then, in FIG. 7D, a second organic insulating layer 82a is formed at a predetermined thickness on the entire surface of the color filter substrate 100 including the first pattern 81. The second organic insulating layer 82a is formed of the same material as the first pattern 81, and is thinner than the first organic insulating layer 81a. Subsequently, a photoresist layer is formed on the second organic insulating layer 82a, and then an exposure and developing process is performed to form a second photoresist pattern 92 having a smaller width than the first photoresist pattern 91a. In FIG. 7E, the second organic insulating layer 82a is selectively removed by using the second photoresist pattern 92 as a mask, thereby forming the second pattern 82. At this time, the second pattern 82 has the smaller width than the first pattern 81. The first and second patterns 81 and 82 are formed of the same material. Also, after the patterning process, the first and second patterns 81 and 82 are formed in a connected shape. Accordingly, as shown in FIG. 7A to FIG. 7E, the column spacer 300 is formed in a method of forming the different photoresist layers for the respective patterns. However, the column spacer 300 may be formed in a method of directly performing an exposure process to a photosensitive organic resin without forming different photoresist layers. In addition, the column spacer 300 may be formed in a method of forming an organic insulating layer or a photosensitive resin corresponding to a length of the column spacer 300, and patterning the same in a diffraction exposure method with a half-tone mask.

Figure 8A:
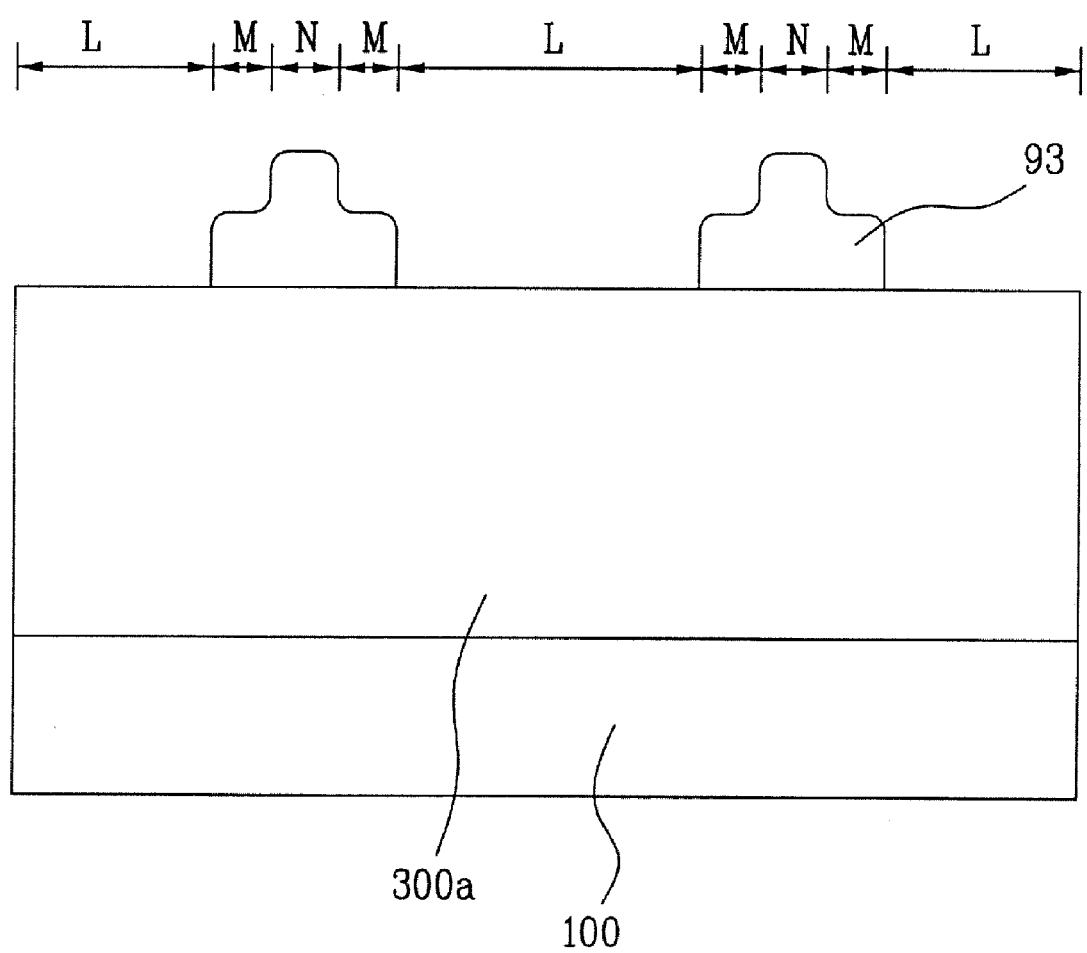
FIG. 8A to FIG. 8C are cross-sectional views illustrating a method of forming a column spacer in a diffraction exposure method according to an embodiment of the invention.
Figure 8B:
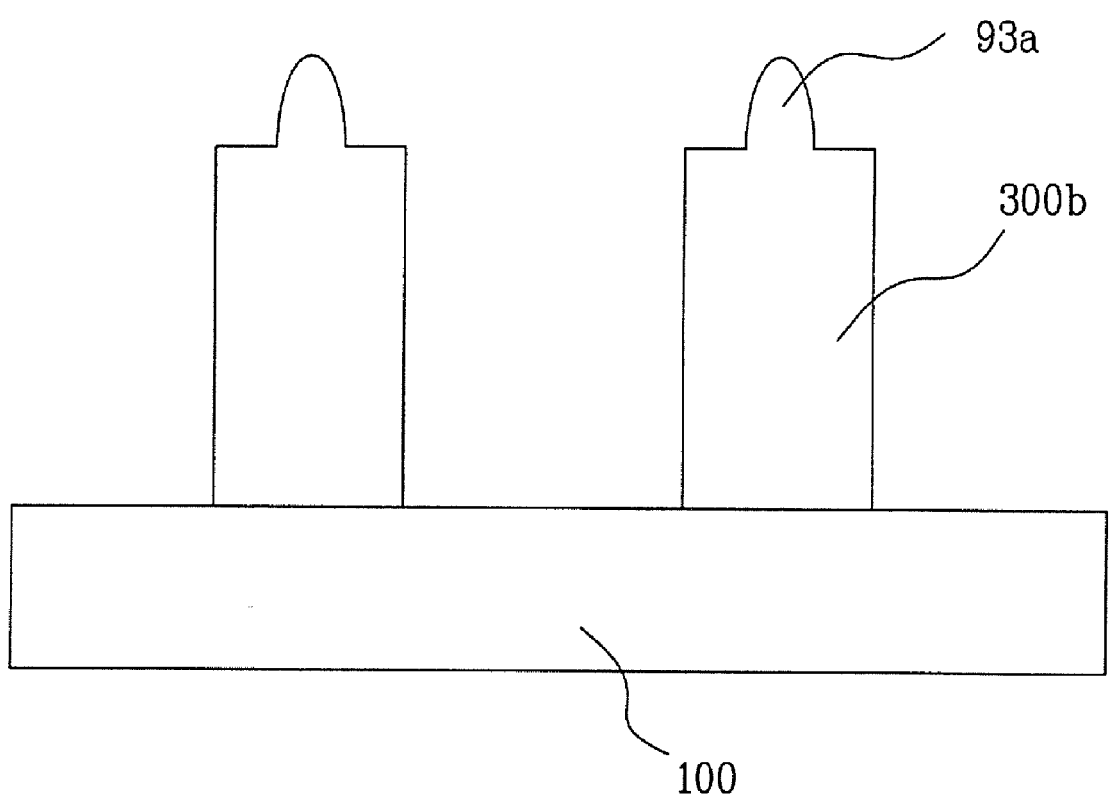
Figure 8C:
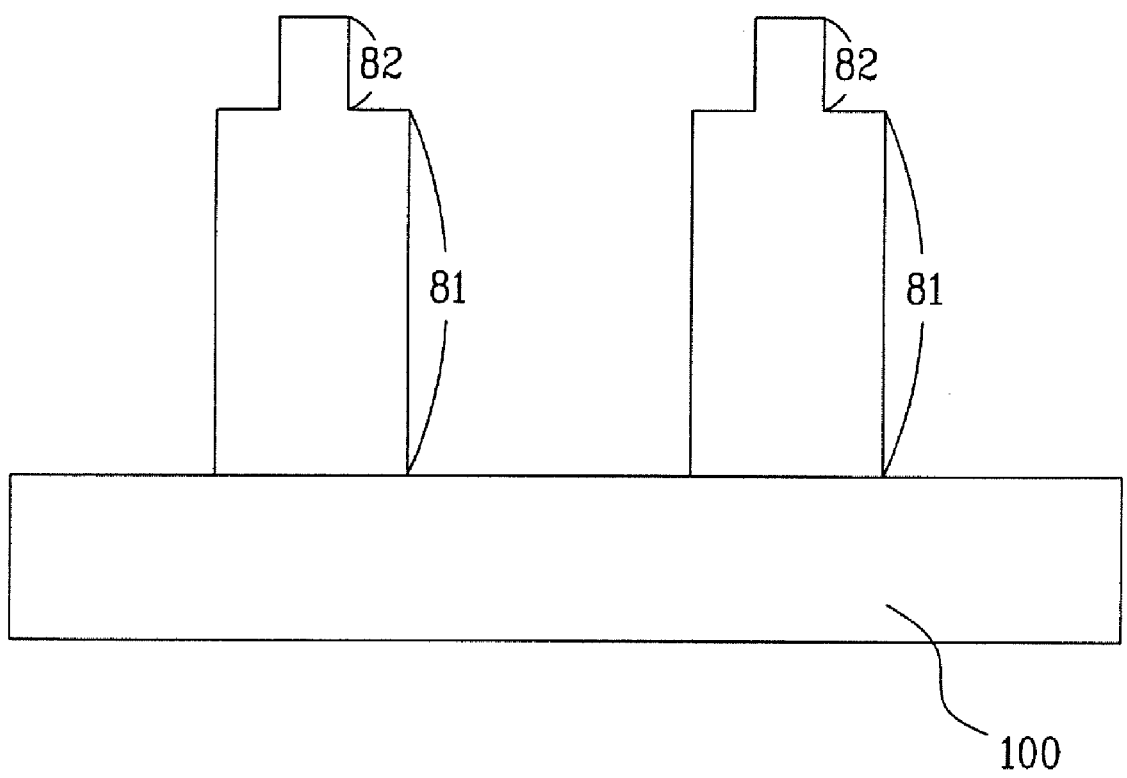

FIG. 8A to FIG. 8C are cross-sectional views illustrating a method of forming the column spacer 300 by using a diffraction exposure method. In FIG. 8A, an organic insulating layer 300a is formed at a thickness corresponding to the height (t1+t2) of the column spacer 300, and then a photoresist layer is formed thereon. Subsequently, a diffraction exposure mask (not shown) having a closed part (N), a semi-transmission part (M) and a transmission part (L) is prepared therein. At this time, the closed part (N) of the diffraction exposure mask is formed of a light-shielding material such as chrome (Cr) or the like The semi-transmission part (M) is formed of a half-tone material for controlling light transmittance. The transmission part (M) is formed of a transparent material such as quartz, or the like By patterning the photoresist layer with the diffraction exposure mask, a photoresist pattern 93 is formed, wherein the transmission part (L) is opened, the closed part (L) has a predetermined height, and the semi-transmission part (M) has a height than lower that of the closed part (L).

After that, in FIG. 8B, the organic insulating layer 300a corresponding to the transmission part (L) is first removed by using the photoresist pattern 93 as a mask, thereby forming an organic insulating pattern 300b. Subsequently, the photoresist pattern 93 is selectively ashed to remove the semi-transmission part (M), whereby a photoresist pattern 93a is formed to have a predetermined thickness at a portion corresponding to the closed part (N).

In FIG. 8C, the organic insulating pattern 300b is selectively removed by using the photoresist pattern 93a as a mask to form the first pattern 81 and the second pattern 82. In addition to the aforementioned diffraction exposure method, the column spacer 300 may be formed in a method of performing an ink-jet process using a roller having a predetermined pattern thereon after forming an organic insulating layer or a photosensitive organic resin at a predetermined thickness.

Herein, the first and second patterns 81, 82 of the column spacer 300 respectively have the heights t1, t2, wherein the height t1 of the first pattern 81 is greater than the height t2 of the second pattern 82. The total height (t1+t2) corresponds to the cell gap. Preferably, the total height is about 2.6 μm to 2.8 μm, and the height t2 of the second pattern 82 is about 0.4 μm to 0.6 μm. Also, the first and second patterns 81, 82 respectively have the sizes corresponding to 10~35 μm×10~35 μm and 10 μm×10 μm. Preferably, the first pattern 81 has the size of 20 μm×20 μm, and the second pattern 82 has the size of 0.4-0.6 μm×0.4-0.6 μm. Accordingly, the column spacer 300 has a small area in contact with the TFT substrate 200. That is, when an LCD panel is touched along a predetermined direction, a frictional force between the column spacer 300 and the TFT substrate 200 is decreased by minimizing the contact area between the column spacer 300 and the TFT substrate 200. In a case where the color filter substrate 100 is shifted by touch, the color filter substrate 100 is easily restored to the original state, thereby preventing spots generated on a screen by touch.

As compared with the column spacer 20 in the related art LCD device, the column spacer 300 of the present invention forms 'B' region (see FIG. 6) having no second pattern 82 therein. When a liquid crystal material is dispersed on the color filter substrate 100 or the TFT substrate 200, or a liquid crystal material is injected between the two substrates 100 and 200, 'A' region (see FIG. 6) is firstly filled with the liquid crystal material, and then the 'B' region is filled in a case where the amount of liquid crystal material is great. In the initial state of injecting the liquid crystal material, the 'B' region is not filled with the liquid crystal material. Even though the 'B' region is empty, no problem happens because the 'B' region is hidden by the first pattern 81 of the column spacer 300. However, when the amount of liquid crystal material increases and the liquid crystal is maintained in a high temperature, expansion force of the liquid crystal becomes greater. Accordingly, it requires more space to receive the liquid crystal material. In this situation, the 'B' region adjacent to the second pattern 92 serves as the space for receiving the liquid crystal material, thereby controlling the gather of the liquid crystal material due to gravity.

Figure 9:
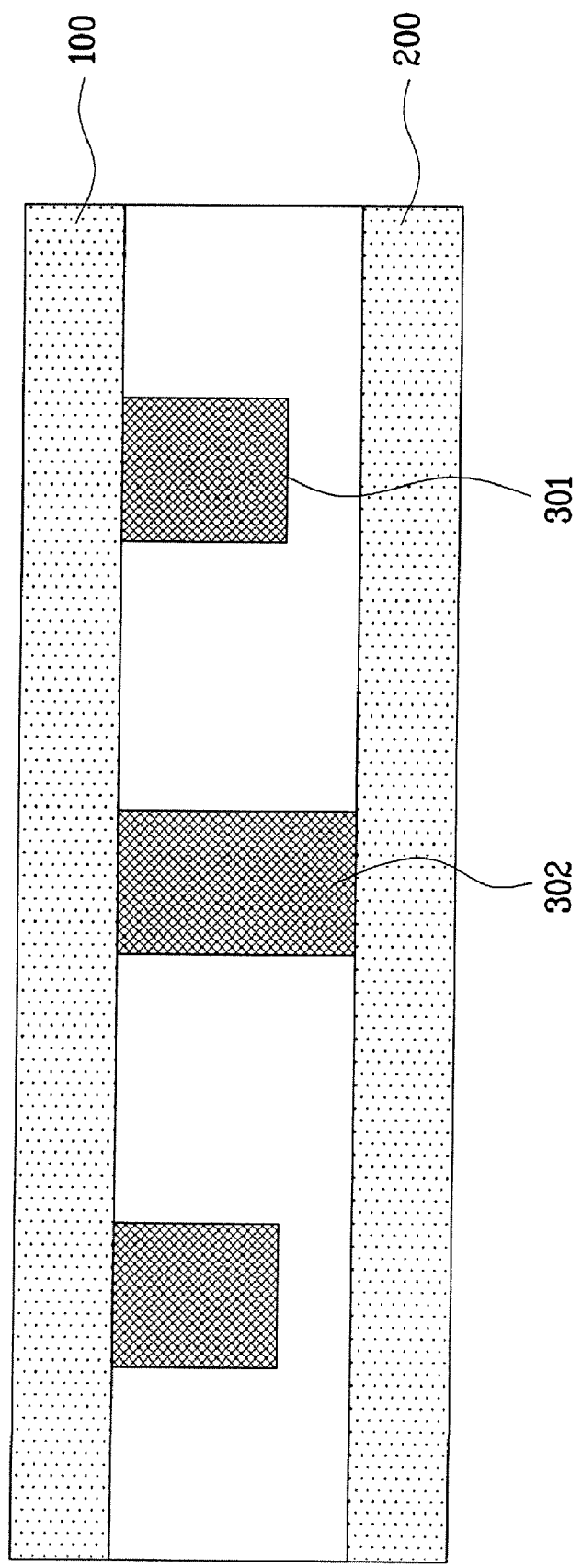
FIG. 9 is a cross-sectional view illustrating an LCD device according to a second embodiment of the present invention.

FIG. 9 is a cross-sectional view illustrating an LCD device according to the second embodiment. As shown in FIG. 9, the LCD device includes a first column spacer 301 and a second column spacer 302, which have the different heights. Here, the first and second column spacers 301, 302 are formed of the same material, and a step difference is formed therebetween. However, the first and second column spacers 301, 302 have the same sized cross-section of 27 μm×27 μm. The first column spacer 301 is formed at a predetermined interval from the TFT substrate 200, whereas the second column spacer 302 is in contact with the TFT substrate 200. In this state, the first column spacer 301 maintains the density of the column spacers in an LCD panel, to prevent the LCD panel from being bent while receiving an external force. Also, the second column spacer 302 is in contact with the TFT substrate 200 to maintain the cell gap between the color filter substrate 100 and the TFT substrate 200. Like the first embodiment, some of the column spacers are not in contact with the TFT substrate 200. Thus, when the LCD panel is touched along the predetermined direction, the frictional force between the column spacer 300 and the TFT substrate 200 is decreased by minimizing the contact area between the column spacer 300 and the TFT substrate 200. That is, when the color filter substrate 100 is shifted by touch, the color filter substrate 100 is easily restored to the original state, thereby preventing spots generated on the screen by touch.

Figure 10:
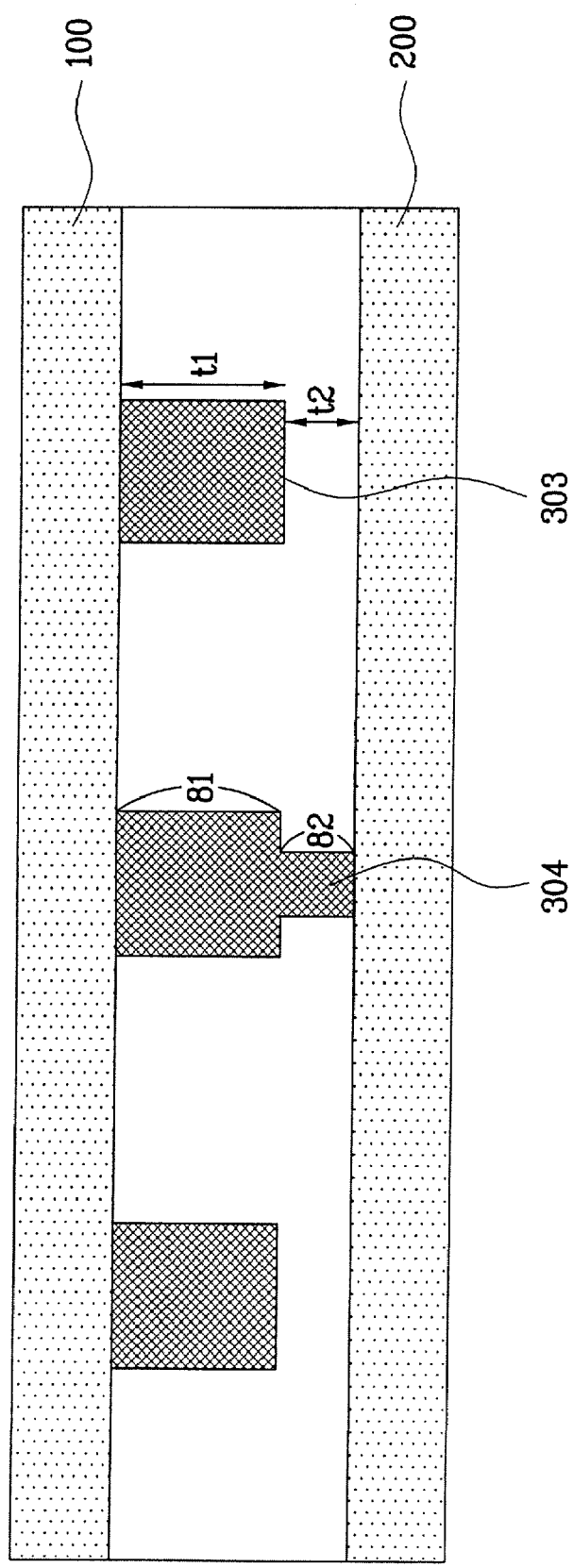
FIG. 10 is a cross-sectional view illustrating an LCD device according to a third embodiment of the present invention.

FIG. 10 is a cross-sectional view illustrating an LCD device according to the third embodiment. As shown in FIG. 10, the LCD device includes a first column spacer 303 and a second column spacer 304. At this time, the first column spacer 303 is formed on the color filter substrate 100 at a predetermined interval from the TFT substrate 200. Then, the second column spacer 304 includes the first pattern 81 and the second pattern 82. The first pattern 81 of the second column spacer 304 has the same height and cross-section as those of the first column spacer 303, and the second pattern 82 having a size smaller than the first pattern 81 is connected to the first pattern 81.

For forming the first and second column spacers 303, 304, a photosensitive organic resin or an insulating organic layer is formed at a thickness corresponding to a cell gap, and then patterned firstly to form a column spacer region by using a transmission part of a diffraction exposure mask. Subsequently, the remaining portions of the patterned column space region except the second pattern 82 are removed at a predetermined height t2 by using a semi-transmission part of the diffraction exposure mask, thereby forming the first column spacer 303 and the second column spacer 304. As mentioned above, the first and second column spacers 303, 304 may be formed of one layer by using the diffraction exposure mask. Or, the first and second column spacers 303, 304 may be formed in a method of separately forming and patterning respective insulating organic layers or photosensitive organic resin layers for the first and second patterns 81, 82. Accordingly, the first column spacer 303 is formed at the predetermined interval of t2 from the TFT substrate 200, and the second pattern 82 of the second column spacer 304 is in contact with the TFT substrate 200. As compared with the LCD device having the constant contact area between the column spacer and the TFT substrate, the LCD device of the second embodiment is capable of preventing the gather of the liquid crystal molecules when an LCD panel is touched along a predetermined direction, because the liquid crystal molecules are easily restored to the original state. Also, it is possible to decrease the gather of the liquid crystal molecules to a predetermined direction due to gravity.

Figure 11:
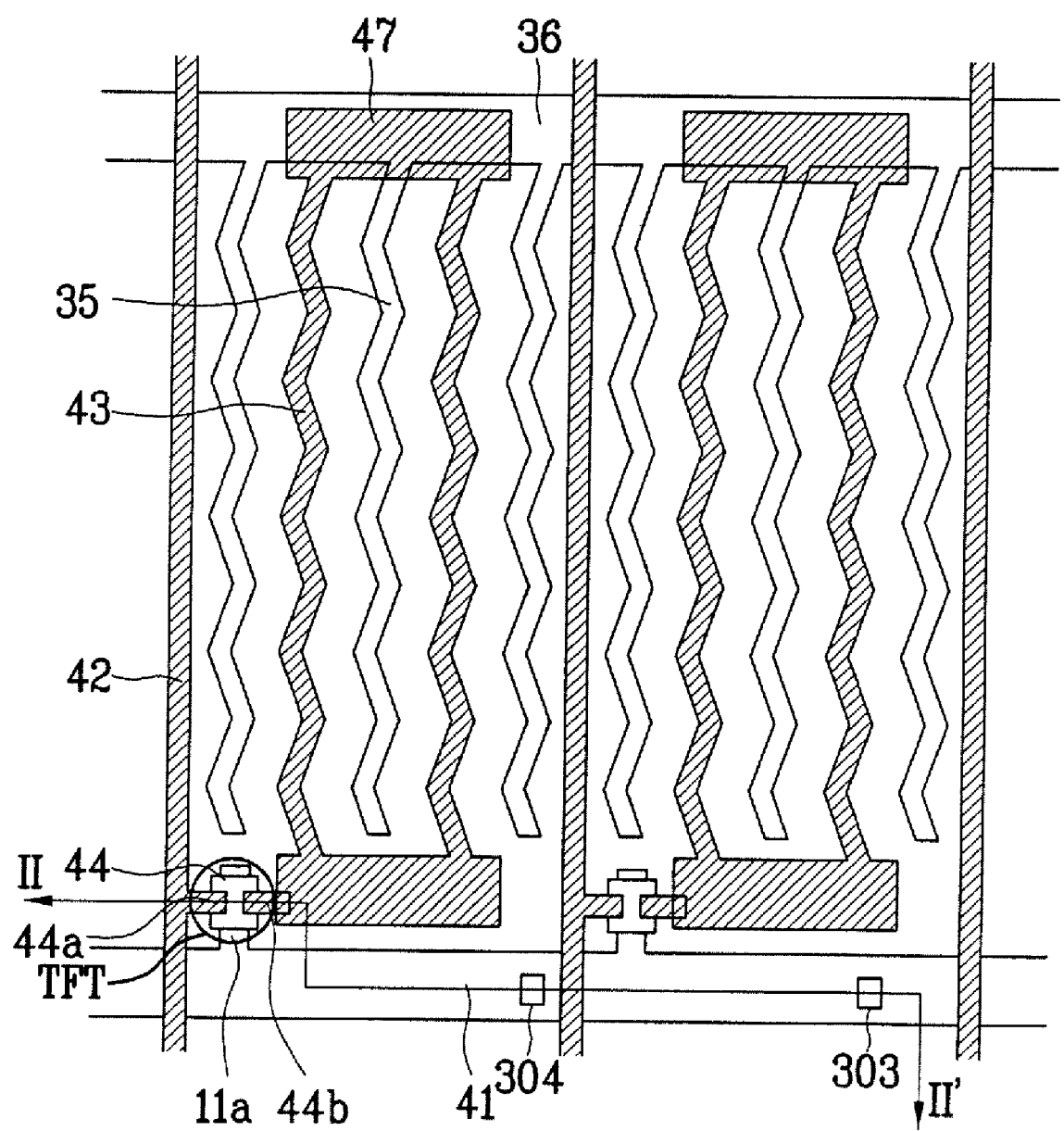
FIG. 11 is a plane view illustrating an IPS mode LCD device according to the third embodiment.
Figure 12:
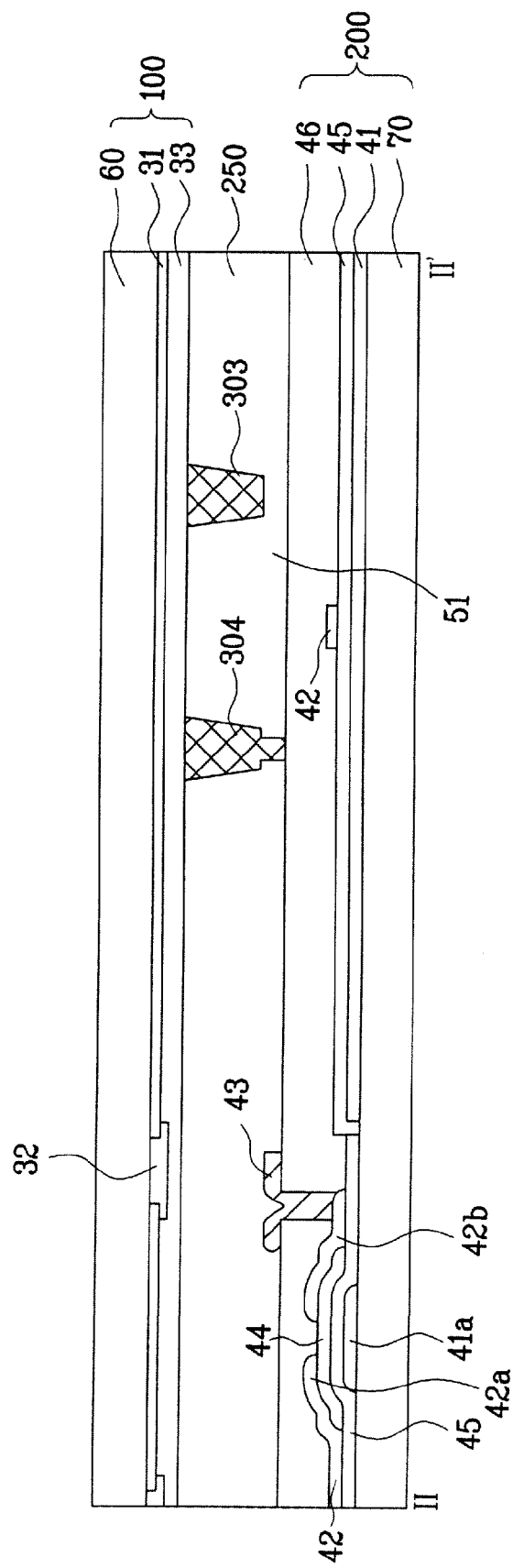
FIG. 12 is a cross-sectional view taken along line II-II' of FIG. 11.

Next, an LCD device according to the third embodiment and a method of fabricating the same will be described with reference to the accompanying drawings. FIG. 11 is a plane view illustrating an IPS mode LCD device according to the third embodiment. FIG. 12 is a cross-sectional view taken along line II-II' of FIG. 11. As shown in FIG. 11 and FIG. 12, the LCD device includes the color filter substrate 100 and the TFT substrate 200 bonded to each other at a predetermined interval, and the liquid crystal layer 250 formed by injecting a liquid crystal material between the color filter substrate 100 and the TFT substrate 200.

Specifically, the color filter substrate 100 includes a black matrix layer 31, an R/G/B color filter layer 32 and an overcoat layer 33 on a glass substrate 60. The black matrix layer 31 excludes light from portions (corresponding to gate and data lines and thin film transistors) except respective pixel regions. The color filter layer 32 is formed to display various colors at the portions corresponding to the respective pixel regions, and the overcoat layer 33 is formed to flatten an upper side of the black matrix layer 31 and the color filter layer 32. After that, the first and second column spacers 303, 304 are formed on predetermined portions of the overcoat layer 33. Herein, the first and second column spacers 303, 304 are formed of photosensitive resin. The second column spacer 304 is formed in the same method as that of the column spacer 300 in the first embodiment. That is, as shown in FIG. 7A to FIG. 7E, the second column spacer 304 in the third embodiment may be formed in the separate patterning process for first and second patterns. Or, by using the diffraction exposure method explained in FIG. 8A to FIG. 8C, the second pattern 304 in the third embodiment may be formed to have the first pattern 81 of the first cross-section and the first height t1, and the second pattern 82 of the second cross-section and the second height t2. The second pattern 82 is connected to and formed on the first pattern 81. Also, the first cross-section of the first pattern 81 is greater than the second cross-section of the second pattern 82, and the first height t1 of the first pattern 81 is the same as or greater than the second height t2 of the second pattern 82. When the patterning process is conducted for defining the second pattern 82, the first column spacer 303 is formed by removing an organic insulating layer at a thickness corresponding to the height t2 of the second pattern 82 in a first column spacer region. After that, an alignment layer (not shown) is formed on an entire surface of the overcoat layer 33 including the first and second column spacers 303, 304, and then a rubbing process is performed thereto. In the process of rubbing the substrate, the surface of the alignment layer is rubbed with the cloth at a uniform pressure and speed. Thus, polymer chains of the alignment layer are aligned at a predetermined direction, thereby determining an initial alignment direction of the liquid crystal.

The TFT substrate 200 includes a plurality of gate and data lines 41, 42, pixel and common electrodes 43, 35, and a plurality of thin film transistors on a glass substrate 70. The gate and data lines 41, 42 crossing each other are formed on the glass substrate 70, thereby defining the pixel region. Also, the pixel and common electrodes 43, 35 are alternately formed in the pixel region to form an electric field parallel to the substrates. The thin film transistor is formed at a crossing portion of the gate and data lines 41, 42. Furthermore, a common line 36 is formed in parallel to the gate line 41 within the pixel region, and a capacitor electrode 47 extending from the pixel electrode 43 is overlapped with the common line 36. More specifically, the common electrode 35 extends from the common line 36. The gate line 41, the common electrode 35 and the common line 36 may be formed simultaneously. Also, the common electrode 35 and the common line 36 may be formed of low-resistance metal such as Cu, Al, Cr, Mo, Ti, or the like Also, the pixel electrode 43 and the common electrode 35 may be alternately formed in the pixel region. The pixel electrode 43 may be formed on the same layer as the data line 42, or the different layer from the data line 42 (the pixel electrode 43 is formed on the different layer from the data line 42 in the drawings). The pixel electrode 43 and the common electrode 35 may be alternately formed in parallel to each other, or formed in a zigzag type as shown in FIG. 11. Furthermore, an insulating layer may be formed between the common electrode 35 and the pixel electrode 43 to separate the two patterns from each other. The insulating layer may be formed of the same material as a gate insulating layer or a passivation layer, such as silicon nitride, silicon oxide, or the like.

Next, a method of forming the thin film transistor and the pixel electrode will be describe in detail. First, a metal material such as Mo, Al, Cr or the like is formed on the entire surface of the glass substrate 70 by sputtering, and patterned by photolithography, thereby simultaneously forming the plurality of the gate lines 41, and gate electrodes 41a extending from the gate lines 41. During this process, the common line 36 is formed in parallel to the gate line 41, and the common electrode 35 extends from the common line 36 of the pixel region in the zigzag pattern. Subsequently, an insulating material of $SiN_x$ is coated on the entire surface of the glass substrate 70, thereby forming a gate insulating layer 45. Then, an amorphous silicon layer (or polysilicon layer) and a silicon layer heavily doped with phosphorous P are sequentially coated, and then patterned simultaneously, thereby forming a semiconductor layer 44 on the gate insulating layer 45 above the gate electrode 41a.

After that, a metal material such as Mo, Al, Cr or the like is coated on the entire surface of the substrate by sputtering, and patterned by photolithography, thereby forming the data line 42 perpendicular to the gate line 41. Then, source and drain electrodes 42a, 42b are formed at both sides of the semiconductor layer 44. As shown in FIG. 12, the source electrode 42a is projected from the data line 42. In the process of pattering the source and drain electrodes, the doped silicon layer between the source electrode 42a and the drain electrode 42b is removed. Subsequently, a passivation layer 46 of $SiN_x$ is formed on the entire surface of the substrate including the source electrode 42a and the drain electrode 42b in a CVD (chemical vapor deposition) method. The passivation layer 46 may be formed of an inorganic material such as $SiN_x$ or the like. In this preferred embodiment, the passivation layer 46 is formed of an organic material having a low dielectric constant, such as BCB (BenzoCycloButene), SOG (Spin On Glass), acryl or the like, to improve an aperture ratio of liquid crystal cell. Then, the passivation layer 46 is selectively etched on the drain electrode 42b, thereby forming a contact hole exposing a predetermined portion of the drain electrode 42b. After that, a transparent conductive layer is coated on the passivation layer 46 to be electrically connected to the drain electrode 42b through the contact hole by sputtering, and selectively removed to remain on the pixel region, thereby forming the pixel electrode 43 in the pixel region. At this time, the pixel electrode 43 and the common electrode 35 are alternately formed in the pixel region. Although not shown, the alignment layer is formed on the entire surfaces of the color filter substrate 100 and the TFT substrate 200 facing each other, and then the rubbing process is performed thereto.

Figure 13:
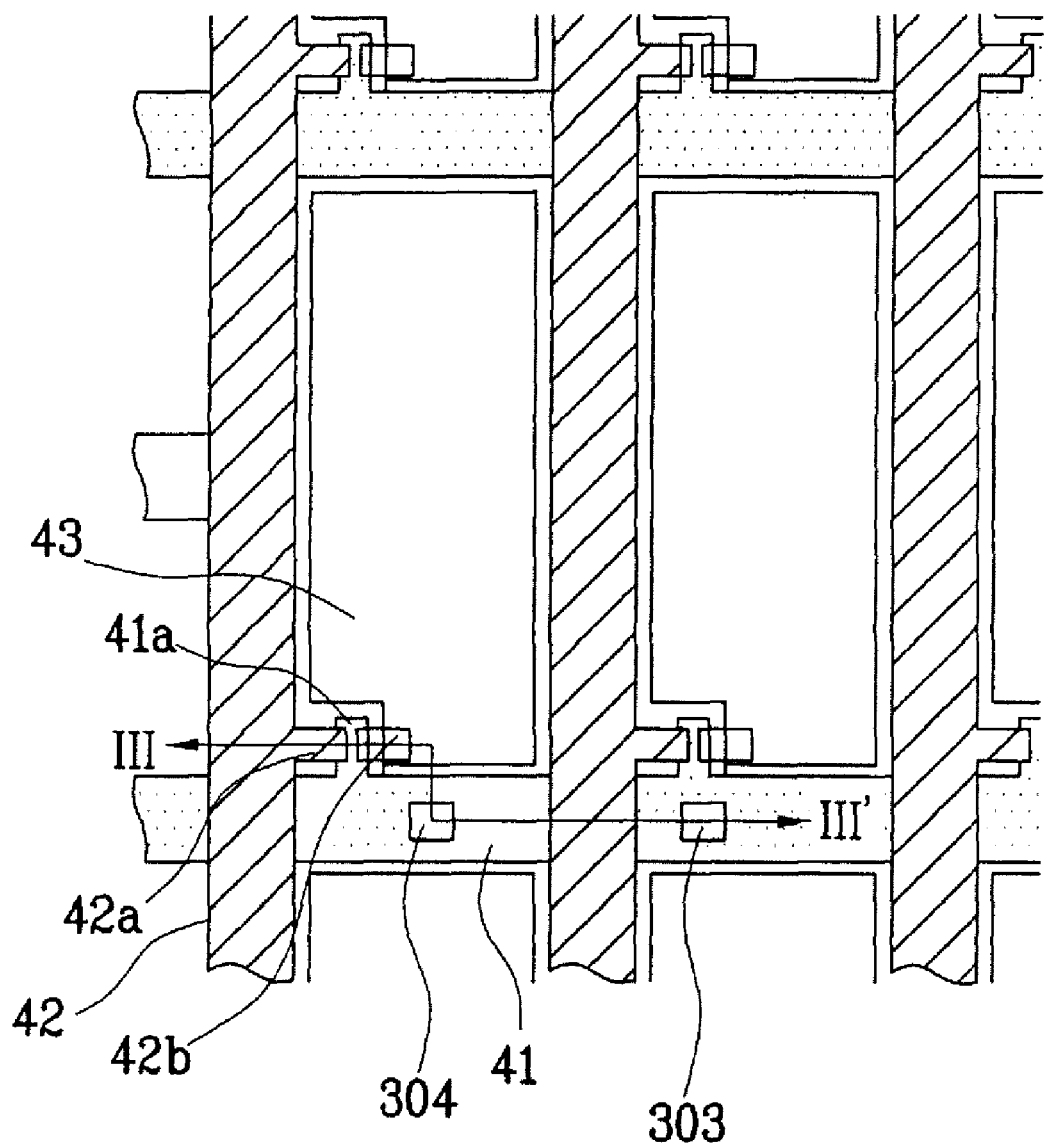
FIG. 13 is a plane view illustrating a TN mode LCD device according to the third embodiment.
Figure 14:
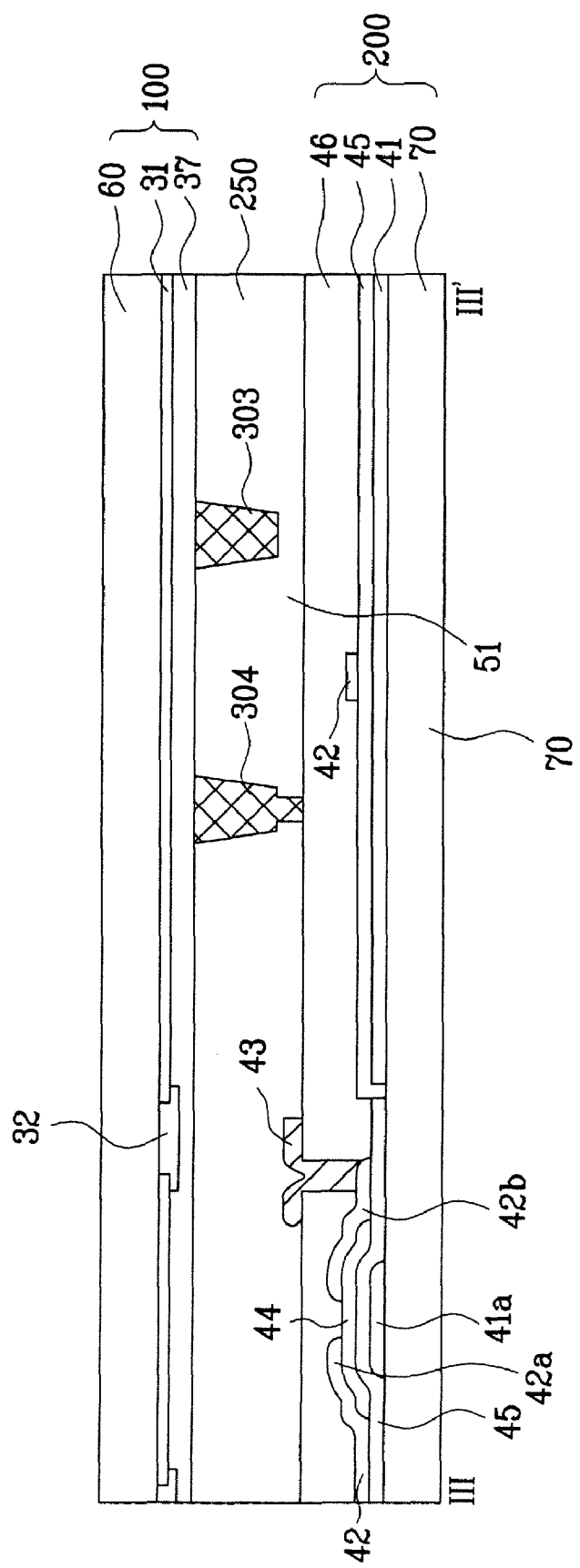
FIG. 14 is a cross-sectional view taken along line III-III' of FIG. 13.

FIG. 13 is a plane view illustrating a TN mode LCD device according to the third embodiment. FIG. 14 is a cross-sectional view taken along line III-III' of FIG. 13. As shown in FIGS. 13 and 14, the TN mode LCD device includes the color filter substrate 100 and the TFT substrate 200 facing each other, and the liquid crystal layer 250 formed by injecting a liquid crystal material between the color filter substrate 100 and the TFT substrate 200.

Specifically, the color filter substrate 100 forms the black matrix layer 31, the R/G/B color filter layer 32 and a common electrode 37, on the glass substrate 60. The black matrix layer 31 excludes light from portions (corresponding to gate and data lines and thin film transistors) except respective pixel regions. The color filter layer 32 is formed to display various colors at the portions corresponding to the respective pixel regions, and the common electrode 37 of ITO is formed on an entire surface of the substrate to flatten an upper side of the black matrix layer 31 and the color filter layer 32. Then, first and second column spacers 303, 304 are formed on predetermined portions of the common electrode 37. At this time, the first and second column spacers 303 and 304 are formed of photosensitive resin. The second column spacer 304 includes the first pattern 81 having the first cross-section, and the second pattern 82 having the second cross-section. The first cross-section of the first pattern 81 is greater than the second cross-section of the second pattern 82. Also, the second pattern 82 is connected the first pattern 81. After that, an alignment layer (not shown) is formed on the surface of the first and second column spacers 303, 304, and a rubbing process is performed thereto. On the rubbing process, the surface of the alignment layer is rubbed with the cloth at a uniform pressure and speed. Thus, polymer chains of the alignment layer are aligned at a predetermined direction, thereby determining an initial alignment direction of the liquid crystal.

Next, the TFT substrate 200 forms a plurality of the gate and data lines 41, 42, a plurality of the pixel electrodes 43, and a plurality of the thin film transistors, on the glass substrate 70. The gate and data lines 41, 42 crossing each other are formed on the glass substrate 70, thereby defining the pixel region. Also, the pixel electrode 43 is formed in the pixel region, and the thin film transistor is formed at a crossing portion of the gate and data lines 41, 42.

A method of forming the thin film transistor and the pixel electrode will be described in detail. First, a metal material such as Mo, Al, Cr or the like is formed on the entire surface of the glass substrate 70 by sputtering, and patterned by photolithography, thereby simultaneously forming the plurality of gate lines 41 and gate electrodes 41a extending from the gate lines 41. Subsequently, an insulating material of $SiN_x$ or the like is coated on the entire surface of the glass substrate 70 including the gate lines 41, thereby forming the gate insulating layer 45. Then, an amorphous silicon layer (or polysilicon layer) and a silicon layer heavily doped with phosphorous P are sequentially coated, and then patterned simultaneously, thereby forming the semiconductor layer 44 on the gate insulating layer above the gate electrode 41a.

Next, a metal material such as Mo, Al, Cr or the like is coated on the entire surface of the substrate by sputtering, and patterned by photolithography, thereby forming the data line 42 perpendicular to the gate line 41. Simultaneously, the source and drain electrodes 42a and 42b are formed at both sides of the semiconductor layer 44. As shown in FIG. 14, the source electrode 42a is projected from the data line 42. In the process of pattering the source and drain electrodes, the doped silicon layer between the source electrode 42a and the drain electrode 42b is removed. Subsequently, a passivation layer 46 of $SiN_x$ is formed on the entire surface of the substrate including the source electrode 42a and the drain electrode 42b in a CVD (chemical vapor deposition) method. The passivation layer 46 may be formed of an inorganic material such as $SiN_x$ or the like. In this preferred embodiment, the passivation layer 46 is formed of an organic material having a low dielectric constant, such as BCB (BenzoCycloButene), SOG (Spin On Glass), acryl or the like, to improve an aperture ratio of liquid crystal cell. Then, the passivation layer 46 is selectively etched on the drain electrode 42b, thereby forming a contact hole exposing a predetermined portion of the drain electrode 42b. After that, a transparent conductive layer is coated on the passivation layer 46 to be electrically connected to the drain electrode 42b through the contact hole by sputtering, and selectively removed to remain on the pixel region, thereby forming the pixel electrode 43 in the pixel region. Although not shown, the alignment layer is formed on the entire surfaces of the color filter substrate 100 and the TFT substrate 200 facing each other, and then the rubbing process is performed thereto.

In the meantime, the column spacers 303, 304 are formed on the black matrix layer 31 to prevent an aperture ratio from being low. In the preferred embodiment, the column spacer is formed on the color filter substrate. However, it is possible to form the column spacer on the TFT substrate.

As mentioned above, the LCD device according to the present invention and the method of fabricating the same has the following advantages. As the large sized LCD panel is developed, the liquid crystal layer of the LCD device is formed in the liquid crystal dispersion method to improve yield. Also, in the process of forming the column spacer, it is required to vary a shape of the column spacer, thereby decreasing the contact area between the column spacer and the opposing substrate. Thus, it is possible to decrease the frictional force between the column spacer and the opposing substrate. Accordingly, even though the surface of the LCD panel is rubbed along a predetermined direction, the frictional force is decreased between the column spacer and the opposing substrate. That is, it is possible to prevent the spots by touch by improving the restoring force of the liquid crystal, thereby improving the luminance and sensitivity of the LCD panel. Also, the column spacers having the varied shape are formed selectively, and some of the column spacers are formed at the predetermined interval from the opposing substrate to prevent the LCD panel from being bent by the external force. In this respect, it is possible to improve yield in fabricating the LCD device, and to solve the aforementioned problems such as spots and hollow portion on the LCD panel, thereby obtaining the result of putting the large sized LCD panel to practical use.

It will be apparent to those skilled in the art that various modifications and variations can be made in the embodiments of the invention. Thus, it is intended that the embodiments of the invention covers the modifications and variations of this invention provided they come within the scope of the appended claims and their equivalents.

What is claimed is:

1. A liquid crystal display (LCD) device comprising:
    a first substrate having a TFT array;
    a second substrate having a color filter array opposing to the first substrate;
    a first column spacer on the second substrate, the first column spacer comprising a first pattern having a first cross-section and a first height and a second pattern having a second cross-section and a second height smaller than that of the first pattern, the first and second patterns being directly connected to each other;
    a second column spacer on the second substrate to have a height corresponding to the first height of the first pattern of the first column spacer; and
    a liquid crystal layer between the first and second substrates,
    wherein the second pattern is arranged in a center portion of the first pattern and in contact with the first substrate,
    wherein the first pattern and the second pattern are formed of a same material in a single layer structure and,
    wherein the first pattern has a first cross-section of about 10 µm~35 µm×10 µm~35 µm, and the second pattern has a second cross-section of about 0.1 µm~10 µm×0.1 µm~10 µm.

2. The LCD device of claim 1, further comprising alignment layers on the first and second substrates.

* * * * *